(12) United States Patent
Hsieh et al.

(10) Patent No.: US 7,489,068 B2
(45) Date of Patent: Feb. 10, 2009

(54) LIGHT EMITTING DEVICE

(75) Inventors: Min-Hsun Hsieh, Hsinchu (TW); Ta-Cheng Hsu, Hsinchu (TW); Wei-Chih Peng, Hsinchu (TW); Ya-Ju Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 491 days.

(21) Appl. No.: 11/326,750

(22) Filed: Jan. 6, 2006

(65) Prior Publication Data
US 2006/0163595 A1 Jul. 27, 2006

(30) Foreign Application Priority Data
Jan. 25, 2005 (TW) .............. 94102193 A

(51) Int. Cl.
*H01J 5/16* (2006.01)
(52) U.S. Cl. .............. 313/116; 313/498; 313/506
(58) Field of Classification Search ............ 313/116, 313/498, 506
See application file for complete search history.

(56) References Cited

U.S. PATENT DOCUMENTS

| 6,442,184 | B1 | 8/2002 | Ota et al. ............... 372/43 |
| 6,657,236 | B1 | 12/2003 | Thibeault et al. ........... 257/98 |
| 2002/0017652 | A1 | 2/2002 | Illek et al. ............... 257/95 |
| 2004/0104672 | A1* | 6/2004 | Shiang et al. ............ 313/506 |

FOREIGN PATENT DOCUMENTS

TW          544958          8/1992

* cited by examiner

*Primary Examiner*—Vip Patel
(74) *Attorney, Agent, or Firm*—J.C. Patents

(57) ABSTRACT

A light emitting device having a transparent substrate, a light emitting stack, and a transparent adhesive layer is provided. The light emitting stack is disposed above the transparent substrate and comprises a diffusing surface. The transparent adhesive layer is disposed between the transparent substrate and the diffusing surface of the light emitting stack; an index of refraction of the light emitting stack is different from that of the transparent adhesive layer.

28 Claims, 4 Drawing Sheets

LIGHT EMITTING DEVICE

CROSS-REFERENCE TO RELATED APPLICATION

This application claims the priority benefit of Taiwan application serial no. 94102193, filed on Jan. 25, 2005. All disclosure of the Taiwan application is incorporated herein by reference.

BACKGROUND OF THE INVENTION

1. Technical Field

The present invention relates to a light emitting device and in particular to a light emitting device having a diffusing surface.

2. Description of the Related Art

Light emitting devices have been employed in a wide variety of applications, including optical displays, traffic lights, data storage apparatus, communication devices, illumination apparatus, and medical treatment equipment. How to improve the light emitting efficiency of light emitting devices is an important issue in this art.

Referring to FIG. 1, according to Snell's law, when a light is directed from one material with an index of refraction n1 towards another material with an index of refraction n2, the light will be refracted if its incident angle is smaller than a critical angle $\theta_c$. Otherwise, the light will be totally reflected from the interface between the two materials. In other words, when a light beam generated from a light emitting diode (LED) travels across an interface from a material of a higher index of refraction to a material of a lower index of refraction, the angle between the incident light beam and the reflected light beam must be equal or less than $2\theta_c$ for the light to be emitted out. It means that when the light generated from the LED travels from an epitaxial layer having a higher index of refraction to a medium having a lower index of refraction, such as a substrate, air and so on, a portion of the light will be refracted into the medium, and another portion of the light with an incident angle larger than the critical angle will be reflected to the epitaxial layer of the LED. Because the environment surrounding the epitaxial layer of the LED has a lower index of refraction, the reflected light can be reflected for several times inside the LED and finally a certain portion of said reflected light can be absorbed.

In U.S. Patent Publication No. 2002/0017652 entitled "Semiconductor Chip for Optoelectronics", an epitaxial layer of a light-emitting device forming on a non-transparent substrate is etched to form a micro reflective structure having a multiplicity of semi-spheres, pyramids, or cones, then a metal reflective layer is deposited on the epitaxial layer. The top of the micro reflective structure is bonded to a conductive carrier (silicon wafer), and then the non-transparent substrate of the epitaxial layer is removed. All the light generated from the light emitting layer and incident to the micro reflective structure will be reflected back to the epitaxial layer and emitted out of the LED with a direction perpendicular to a light emitting surface. Therefore, the light will not be restricted by the critical angle any more.

SUMMARY

Accordingly, the present invention is directed to a light emitting device utilizing a diffusing surface formed in a light emitting stack of the light emitting device to increase the light extraction efficiency and further improve its light emitting efficiency.

The present invention is directed to a light emitting device to enhance the light extraction efficiency of the light emitting device and further improve the light emitting efficiency.

As embodied and broadly described herein, the present invention provides a light emitting device comprising a transparent substrate, a light emitting stack and a transparent adhesive layer. The light emitting stack is disposed above the transparent substrate and comprises a diffusing surface. The transparent adhesive layer is disposed between the transparent substrate and the diffusing surface of the light emitting stack, wherein an index of refraction of the light emitting stack is different from that of the transparent adhesive layer.

According to one embodiment of the present invention, a material of the transparent substrate is selected from one of the group consisting of GaP, SiC, $Al_2O_3$ and glass.

According to one embodiment of the present invention, a material of the light emitting stack is selected from one of the group consisting of AlGaInP, AlN, GaN, AlGaN, InGaN and AlInGaN.

According to one embodiment of the present invention, a material of the transparent adhesive layer is selected from one of the group consisting of polyimide, benzocyclobutene (BCB), prefluorocyclobutane (PFCB) and indium tin oxide.

According to one embodiment of the present invention, the diffusing surface is a rough surface.

According to one embodiment of the present invention, the rough surface comprises a plurality of micro protrusions. The shape of the micro protrusions is selected from one of the group consisting of semi-sphere, pyramid, pyramid polygon, and combinations thereof.

According to one embodiment of the present invention, the rough surface is a convex-concave surface.

According to one embodiment of the present invention, the light emitting stack comprises a first semiconductor layer, a light emitting layer and a second semiconductor layer. The first semiconductor layer is disposed above the substrate and has the diffusing surface. The light emitting layer is disposed on a portion of the first semiconductor layer. The second semiconductor layer is disposed on the light emitting layer.

According to one embodiment of the present invention, the second semiconductor layer has another diffusing surface.

According to one embodiment of the present invention, the light emitting device further comprises a first electrode and a second electrode. The first electrode is disposed on the first semiconductor layer where the light emitting layer is not disposed thereon, and the second electrode is disposed on the second semiconductor layer.

According to one embodiment of the present invention, the light emitting device further comprises a first transparent conductive layer disposed between the first electrode and the first semiconductor layer.

According to one embodiment of the present invention, a material of the first transparent conductive layer is selected from one of the group consisting of indium tin oxide, cadmium tin oxide, antimony tin oxide, zinc aluminium oxide and zinc tin oxide.

According to one embodiment of the present invention, the light emitting device further comprises a first reaction layer and a second reaction layer. The first reaction layer is disposed between the transparent substrate and the transparent adhesive layer, and the second reaction layer disposed between the transparent adhesive layer and the light emitting stack.

According to one embodiment of the present invention, the first reaction layer is conductive.

According to one embodiment of the present invention, the second reaction layer is conductive.

According to one embodiment of the present invention, a material of the first reaction layer is selected from one of the group consisting of SiNx, Ti and Cr.

According to one embodiment of the present invention, a material of the second reaction layer is selected from one of the group consisting of SiNx, Ti and Cr.

According to one embodiment of the present invention, the second reaction layer is in ohmic contact with the first reaction layer with the existence of the protrusions of the plurality of micro protrusions penetrating through the transparent adhesive layer.

According to one embodiment of the present invention, the second reaction layer is in ohmic contact with the first reaction layer with the existence of the convex part of the convex-concave surface penetrating through the transparent adhesive layer.

According to one embodiment of the present invention, the light emitting stack comprises a first semiconductor layer, a light emitting layer and a second semiconductor layer. The first semiconductor layer is disposed above the substrate and has the diffusing surface. The light emitting layer is disposed on the first semiconductor layer. The second semiconductor layer is disposed on the light emitting layer.

According to one embodiment of the present invention, the transparent substrate is conductive.

According to one embodiment of the present invention, the transparent adhesive layer is a transparent conductive adhesive layer and a material of the transparent conductive adhesive layer is selected from one of the group consisting of intrinsically conductive polymer and polymer having conductive material distributed therein.

According to one embodiment of the present invention, the polymer is selected from one of the group consisting of polyimide, benzocyclobutene (BCB), and prefluorocyclobutane (PFCB).

According to one embodiment of the present invention, the conductive material is selected from one of the group consisting of indium tin oxide, cadmium tin oxide, antimony tin oxide, zinc oxide, zinc tin oxide, Au and Ni/Au.

According to one embodiment of the present invention, the light emitting device further comprises a first electrode and a second electrode. The first electrode is disposed on the second semiconductor layer, and the second electrode is disposed under the transparent substrate.

According to one embodiment of the present invention, the light emitting device further comprises a transparent conductive layer disposed between the second semiconductor layer and the first electrode.

According to one embodiment of the present invention, a material of the transparent conductive layer is selected from one of the group consisting of indium tin oxide, cadmium tin oxide, antimony tin oxide, zinc aluminium oxide and zinc tin oxide.

The present invention is to bond the transparent substrate and the light emitting stack having the diffusing surface together by the transparent adhesive layer. The light emitting stack and the transparent adhesive layer have different indices of refraction, such that the possibility of light extraction of the light emitting device is raised, and the light emitting efficiency is improved, too.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
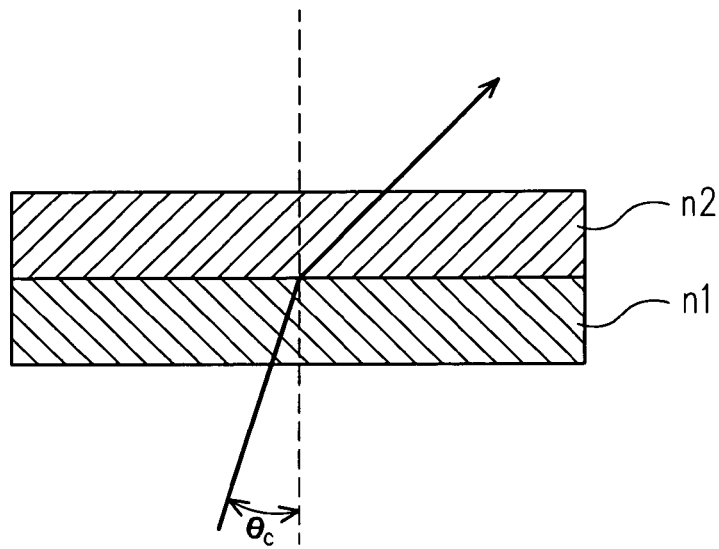
FIG. 1 is a schematic diagram illustrating the Snell's law.

Reference will now be made in detail to the present preferred embodiments of the invention, examples of which are illustrated in the accompanying drawings. Wherever possible, the same reference numbers are used in the drawings and the description to refer to the same or like parts.

Figure 2:
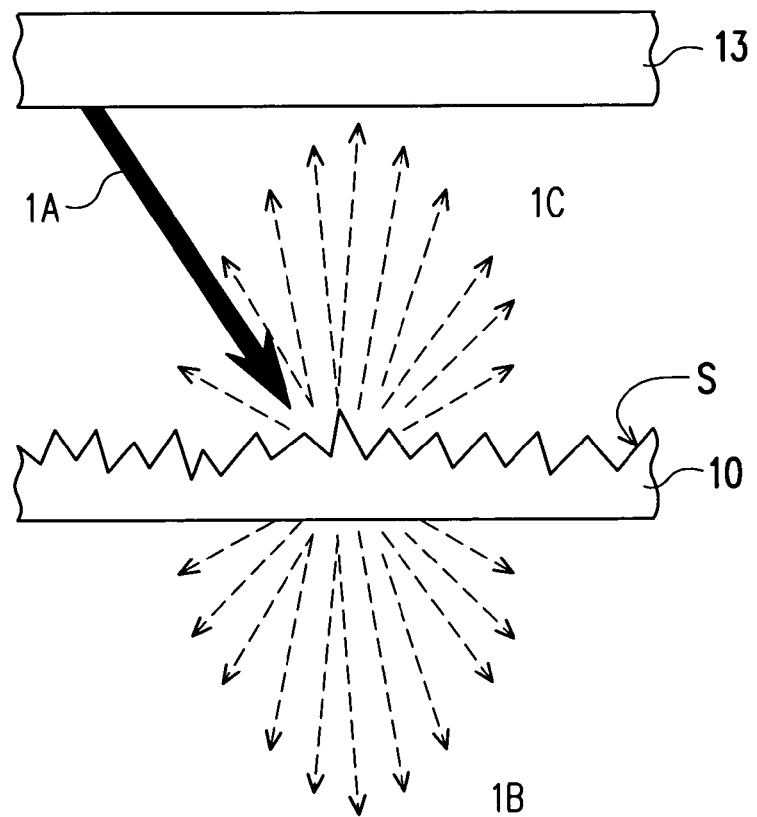
FIG. 2 is a schematic diagram showing a light field of the present invention.

FIG. 2 is a schematic diagram showing a light field of the present invention. Referring to FIG. 2, when a light 1A generated from a light emitting layer 13 is directed towards a diffusing surface S, a portion of the light 1A is refracted to a transparent substrate 10 to form a light field 1B, and another portion of the light 1A is diffused by the diffusing surface S to form a light field 1C. The present invention utilizes the presence of the diffusing surface S to make the light, which is restricted to the critical angle, be reflected to the light emitting layer 13 after diffusion, and the light will be extracted from the front of the light emitting layer 13, such that the light extraction efficiency will be enhanced. If a portion of the diffused light is totally reflected to the diffusing surface S, it will be diffused again to change its incident angle, thus improving the light extraction efficiency. Therefore, no matter how many times the light experiences the total internal reflection, the light will be diffused by the diffusing surface S, to increase a probability of light extraction and enhance the light emitting efficiency.

Figure 3:
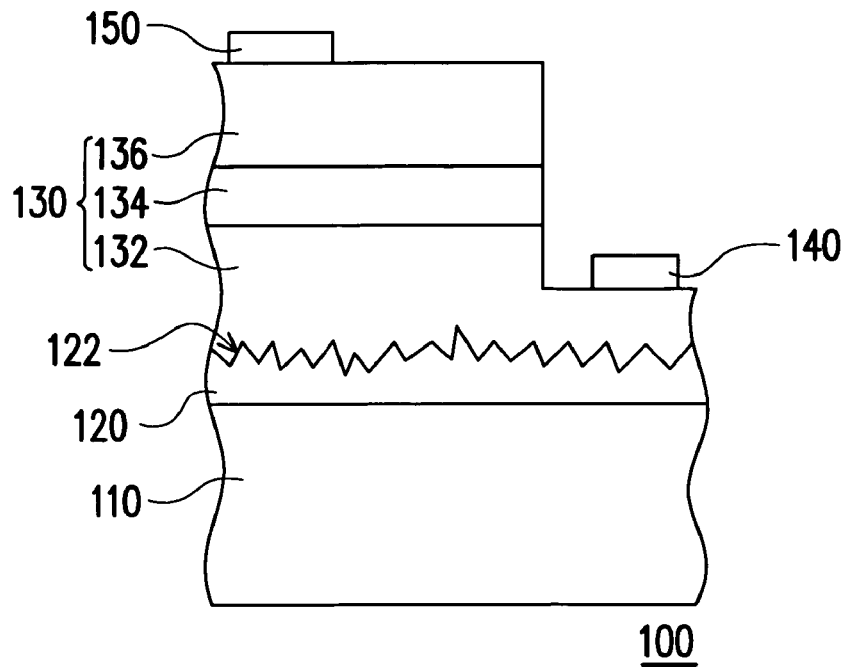
FIG. 3 is a schematic cross-sectional view showing a light emitting device according to a preferred embodiment of the present invention.

FIG. 3 is a schematic cross-sectional view showing a light emitting device according to a preferred embodiment of the present invention. The light emitting device 100 comprises a transparent substrate 110, a transparent adhesive layer 120, a light emitting stack 130, a first electrode 140 and a second electrode 150. In one embodiment of the present invention, the material of the transparent substrate 110 is selected from one of the group consisting of GaP, SiC, Al$_2$O$_3$ and glass. The transparent adhesive layer 120 is formed on the transparent substrate 110, and the material of the transparent adhesive layer 120 can be polyimide, benzocyclobutene (BCB), prefluorocyclobutane (PFCB) or indium tin oxide. The light emitting stack 130 comprises a first semiconductor layer 132, a light emitting layer 134 and a second semiconductor layer 136, and the index of refraction of the light emitting stack 130 is different from that of the transparent adhesive layer 120.

Figure 4:
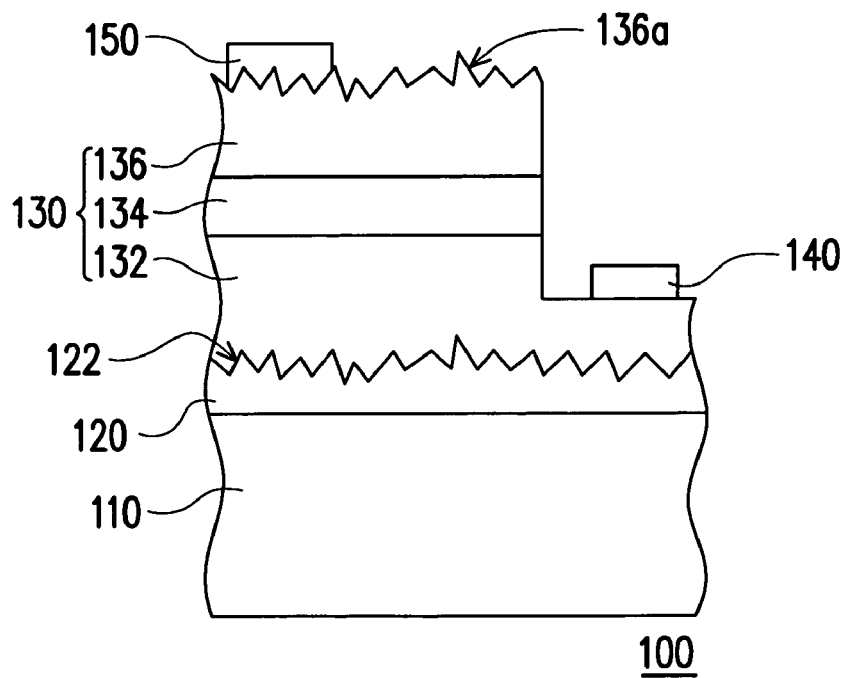
FIG. 4 is a schematic cross-sectional view showing a light emitting device having two diffusing surfaces according to a preferred embodiment of the present invention.

The first semiconductor layer 132 attaches to the transparent substrate 110 through the transparent adhesive layer 120, and has a diffusing surface 122 next to the transparent adhesive layer 120. The material of the first semiconductor layer 132, the light emitting layer 134 and the second semiconductor layer 136 can be AlGaInP, AlN, GaN, AlGaN, InGaN or AlInGaN. An upper surface of the first semiconductor layer 132 has an epitaxy region and an electrode region. The light emitting layer 134 is formed on the epitaxy region of the first semiconductor layer 132. The second semiconductor layer 136 is formed on the light emitting layer 134. The first electrode 140 is formed on the electrode region of the first semiconductor layer 132. The second electrode 150 is formed on the second semiconductor layer 136. Referring to FIG. 4, an upper surface of the second semiconductor layer 136 may further comprise another diffusing surface 136a, thereby enhancing the light extraction efficiency.

The way to form the first semiconductor layer 132, the light emitting layer 134 and the second semiconductor layer 136 on the transparent substrate 110 as shown in FIGS. 3 and 4 is to use an epitaxy method. The diffusing surfaces 122 and 136a are rough surfaces, and they can be formed during the exitaxy process. They also can be formed by etching a part of the first semiconductor layer 132 through wet etching or dry etching, such as inductive coupling plasma (ICP), during the epitaxy process. The light emitting diode having the rough surface is attached to the transparent substrate 110 by the transparent adhesive layer 120.

In another embodiment of the present invention, the diffusing surface 122 of the first semiconductor layer 132 may comprise a plurality of micro protrusions and attaches to the transparent substrate 110 through the transparent adhesive layer 120. The shape of the micro protrusions can be a semisphere, a pyramid or a pyramid polygon. Because of the micro protrusions, the diffusing surface is roughened, and the light extraction efficiency is enhanced.

Figure 5:
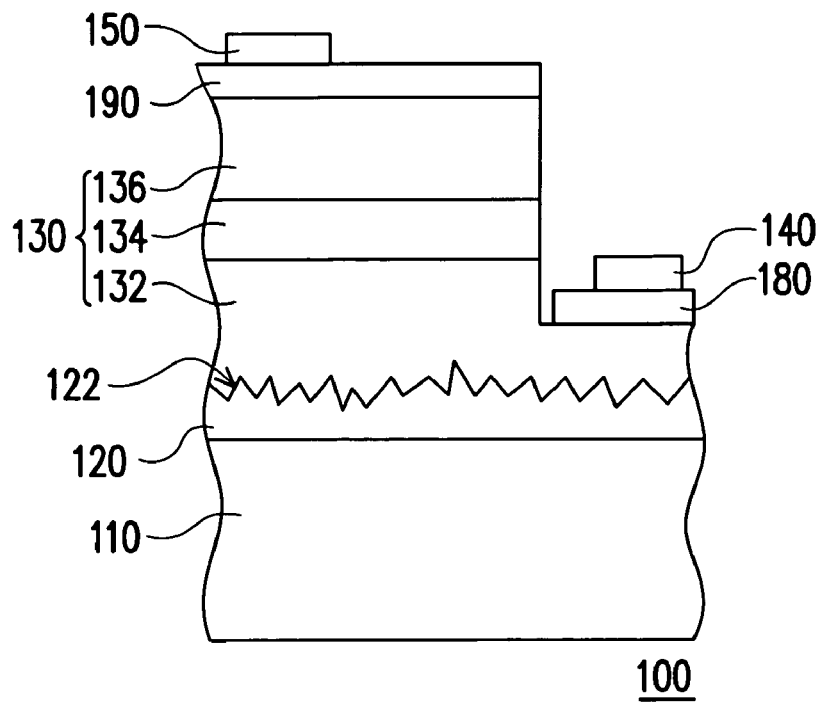
FIG. 5 is a schematic cross-sectional view showing a light emitting device having transparent conductive layers according to a preferred embodiment of the present invention.

In one embodiment of the present invention, referring to FIG. 5, a first transparent conductive layer 180 is selectively disposed between the first electrode 140 and the first semiconductor layer 132. The material of the first transparent conductive layer 180 comprises indium tin oxide, cadmium tin oxide, antimony tin oxide, zinc aluminium oxide or zinc tin oxide. Similarly, a second transparent conductive layer 190 is selectively disposed between the second semiconductor layer 136 and the second electrode 150. The material of the second transparent conductive layer 190 comprises indium tin oxide, cadmium tin oxide, antimony tin oxide, zinc aluminium oxide or zinc tin oxide.

Figure 6:
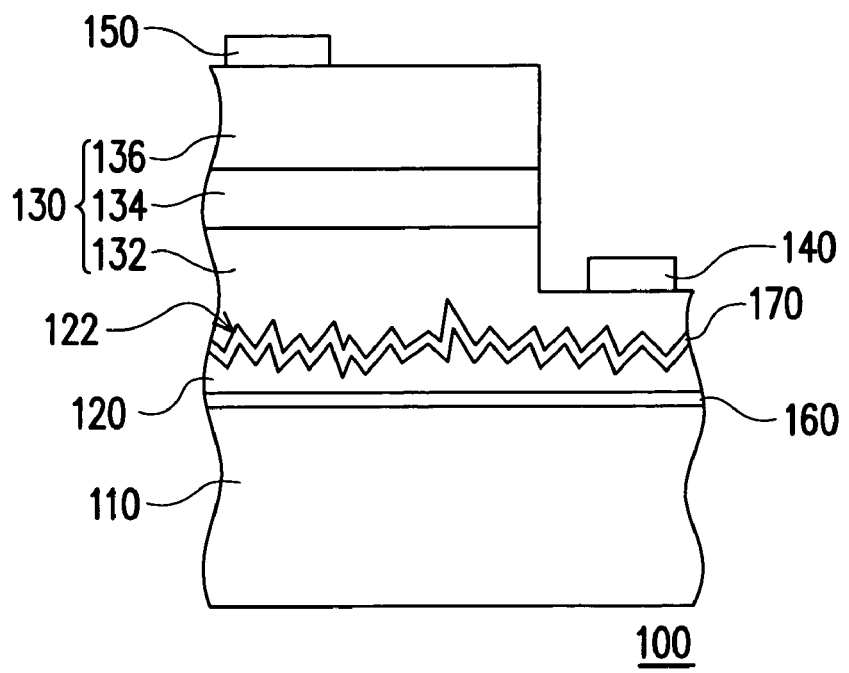
FIG. 6 is a schematic cross-sectional view showing a light emitting device having reaction layers according to a preferred embodiment of the present invention.

Besides, referring to FIG. 6, a first reaction layer 160 can be selectively disposed between the transparent substrate 110 and the transparent adhesive layer 120, and a second reaction layer 170 can be selectively disposed between the transparent adhesive layer 120 and the first semiconductor layer 132, thereby increasing the adhesion of the transparent adhesive layer 120. The material of the first reaction layer 160 and the second reaction layer 170 can be SiNx, Ti or Cr.

Figure 7:
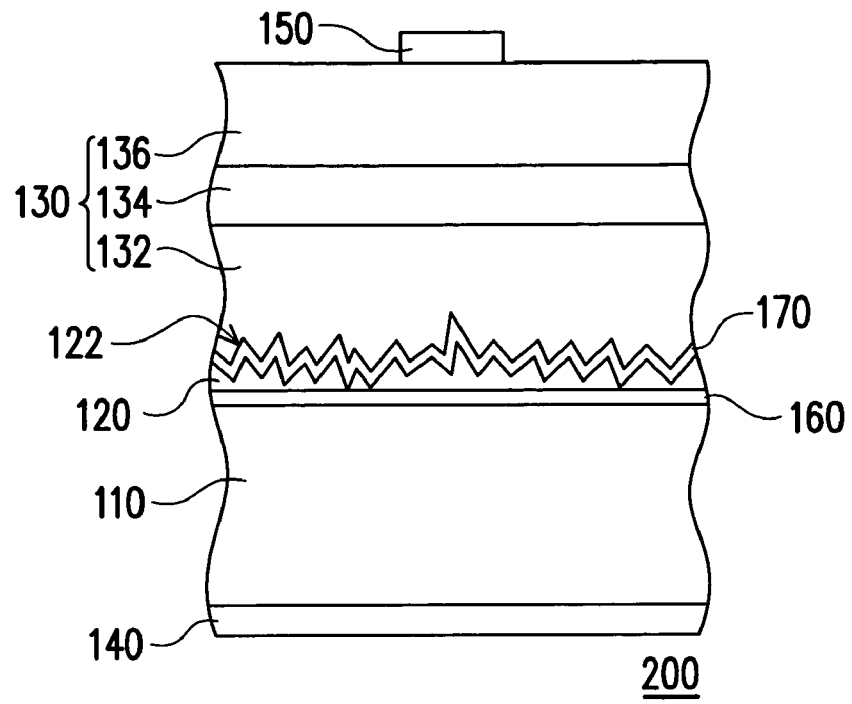
FIG. 7 is a schematic cross-sectional view showing a light emitting device according to another preferred embodiment of the present invention.

FIG. 7 is a schematic cross-sectional view showing a vertical structure light emitting device 200 light emitting device according to another preferred embodiment of the present invention. The transparent substrate 110 is a conductive substrate. The first semiconductor layer 132 with the second reaction layer 170 underneath is coupled to a gel-state transparent adhesive layer 120, and the protrusion part of the second reaction layer 170 penetrates through the transparent adhesive layer 120 and is ohmic contact with the first reaction layer 160 because the first reaction layer 160 and the second reaction layer 170 are both conductive. Then, a first electrode 140 and a second electrode 150 are formed on the lower surface of the transparent substrate 110 and the upper surface of the second semiconductor layer 136 respectively. Similarly, a transparent conductive layer (not shown) is selectively disposed between the second electrode 150 and the second semiconductor layer 136. The material of the transparent conductive layer comprises indium tin oxide, cadmium tin oxide, antimony tin oxide, zinc aluminium oxide or zinc tin oxide.

Figure 8:
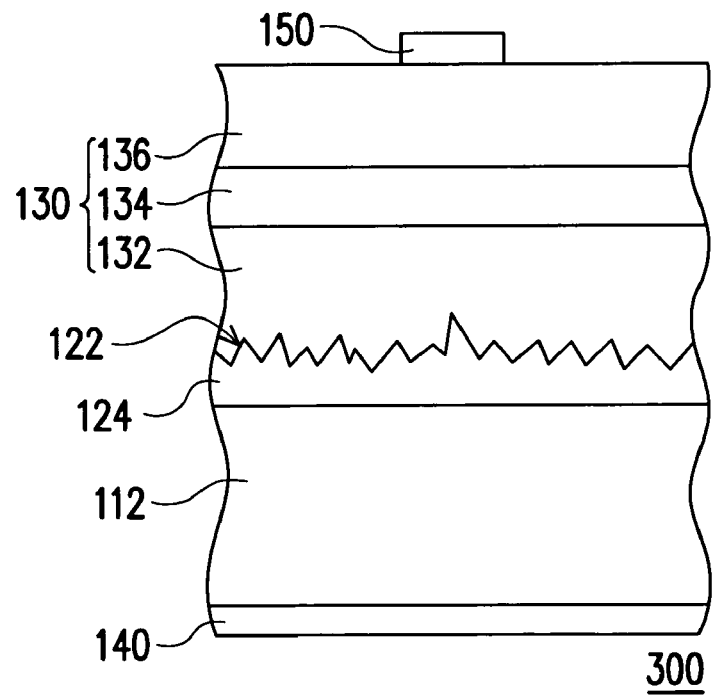
FIG. 8 is a schematic cross-sectional view showing a light emitting device according to another preferred embodiment of the present invention.

FIG. 8 is a schematic cross-sectional view showing a light emitting device according to another preferred embodiment of the present invention. Referring to FIG. 8, the structure of the light emitting device 300 is similar to that of the light emitting device 100 shown in FIG. 3. The difference between them is that a transparent conductive adhesive layer 124 replaces the transparent adhesive layer 120, and the transparent substrate 110 is replaced by a transparent conductive substrate 112, such that the light emitting device 300 is electrically conductive vertically. The transparent conductive adhesive layer 124 is composed of intrinsically conductive polymer or polymer having conductive material distributed therein. The conductive material comprises indium tin oxide, cadmium tin oxide, antimony tin oxide, zinc oxide, zinc tin oxide, Au or Ni/Au. The first electrode 140 is formed under the transparent conductive substrate 112; the second electrode 150 is formed on the second semiconductor layer 136.

In one embodiment of the present invention, the light emitting device 300 further comprises a transparent conductive layer (not shown) disposed between the second electrode 150 and the second semiconductor layer 136. The material of the transparent conductive layer comprises indium tin oxide, cadmium tin oxide, antimony tin oxide, zinc aluminium oxide or zinc tin oxide.

The present invention is to combine the transparent substrate and the light emitting stack together by the transparent adhesive layer having the diffusing surface. The light emitting stack and the transparent adhesive layer have different indices of refraction, such that the possibility of light extraction of the light emitting device is raised, and the light emitting efficiency is improved, too.

It will be apparent to those skilled in the art that various modifications and variations can be made to the structures in accordance with the present invention without departing from the scope or spirit of the invention. In view of the foregoing, it is intended that the present invention cover modifications and variations of this invention provided they fall within the scope of the following claims and their equivalents.

What is claimed is:

1. A light emitting device, comprising:
   a transparent substrate;
   a light emitting stack having a first diffusing surface above the transparent substrate; and
   a transparent adhesive layer between the transparent substrate and the first diffusing surface, wherein an index of refraction of the light emitting stack is different from that of the transparent adhesive layer.

2. The light emitting device according to claim 1, wherein the transparent substrate comprises a material selected from the group consisting of GaP, SiC, $Al_2O_3$, and glass.

3. The light emitting device according to claim 1, wherein the transparent adhesive layer comprises a material selected from the group consisting of polyimide, benzocyclobutene (BCB), prefluorocyclobutane (PFCB), and indium tin oxide.

4. The light emitting device according to claim 1, wherein the first diffusing surface comprises a rough surface.

5. The light emitting device according to claim 4, wherein the rough surface comprises a plurality of micro protrusions.

6. The light-emitting device according to claim 5, wherein the micro protrusions have a shape selected from the group consisting of semi-sphere, pyramid, pyramid polygon, and combinations thereof.

7. The light emitting device according to claim 4, wherein the rough surface comprises a convex-concave surface.

8. The light emitting device according to claim 1, wherein the light emitting stack comprises:
a first semiconductor layer above the substrate and having the first diffusing surface;
a light emitting layer on a portion of the first semiconductor layer; and
a second semiconductor layer on the light emitting layer.

9. The light emitting device according to claim 8, wherein the second semiconductor layer has a second diffusing surface.

10. The light emitting device according to claim 8, further comprising a first electrode and a second electrode, wherein the first electrode is on the first semiconductor layer where the tight emitting layer is not disposed thereon, and the second electrode is on the second semiconductor layer.

11. The light emitting device according to claim 10, further comprising a first transparent conductive layer between the first electrode and the first semiconductor layer.

12. The light emitting device according to claim 11, wherein the first transparent conductive layer comprises a material selected from the group consisting of indium tin oxide, cadmium tin oxide, antimony tin oxide, zinc aluminum oxide, and zinc tin oxide.

13. The light emitting device according to claim 1, further comprising a first reaction layer and a second reaction layer, wherein the first reaction layer is between the transparent substrate and the transparent adhesive layer, and the second reaction layer between the transparent adhesive layer and the light emitting stack.

14. The light emitting device according to claim 13, wherein the first reaction layer comprises a material selected from the group consisting of $SiN_x$, Ti, and Cr.

15. The light emitting device according to claim 13, wherein the second reaction layer comprises a material selected from the group consisting of $SiN_x$, Ti, and Cr.

16. The light emitting device according to claim 13, wherein at least one of the first reaction layer and the second reaction layer is conductive.

17. The light emitting device according to claim 13, wherein the first diffusing surface comprises a plurality of micro protrusions, and the second reaction layer is in ohmic contact with the first reaction layer with the existence of the protrusions penetrating through the transparent adhesive layer.

18. The light emitting device according to claim 17, wherein the micro protrusions have a shape selected from the group consisting of semi-sphere, pyramid, pyramid polygon, and combinations thereof.

19. The light emitting device according to claim 13, wherein the first diffusing surface comprises a convex-concave surface, and the second reaction layer is in ohmic contact with the first reaction layer with the existence of a convex part of the convex-concave surface penetrating through the transparent adhesive layer.

20. The light emitting device according to claim 1, wherein the light emitting stack comprises:
a first semiconductor layer above the substrate and having the first diffusing surface;
a light emitting layer on the first semiconductor layer; and
a second semiconductor layer on the light emitting layer.

21. The light-emitting device according to claim 20, wherein the transparent substrate is conductive.

22. The light emitting device according to claim 20, wherein the second semiconductor layer has a second diffusing surface.

23. The light emitting device according to claim 20, wherein the transparent adhesive layer is a conductive adhesive layer and the transparent conductive adhesive layer comprises a material selected from the group consisting of intrinsically conductive polymer and polymer having conductive material distributed therein.

24. The light emitting device according to claim 23, wherein the polymer having conductive material distributed therein is selected from the group consisting of polyimide, benzocyclobutene (BCB), and prefluorocyclobutane (PFCB).

25. The light emitting device according to claim 23, wherein the conductive material comprises a material selected from the group consisting of indium tin oxide, cadmium tin oxide, antimony tine oxide, zinc oxide, zinc tin oxide, Au, and Ni/Au.

26. The light emitting device according to claim 20, further comprising a first electrode and a second electrode, wherein the first electrode is on the second semiconductor layer, and the second electrode is under the transparent substrate.

27. The light emitting device according to claim 26, further comprising a transparent conductive layer between the second semiconductor layer and the first electrode.

28. The light emitting device according to claim 27, wherein the transparent conductive layer comprises a material selected from the group consisting of indium tin oxide, cadmium tin oxide, antimony tin oxide, zinc aluminum oxide, and zinc tin oxide.

* * * * *